United States Patent
Yoshinaga

(10) Patent No.: US 8,890,632 B2
(45) Date of Patent: Nov. 18, 2014

(54) OSCILLATOR CIRCUIT

(75) Inventor: Hisahiko Yoshinaga, Gunma (JP)

(73) Assignee: Semiconductor Components Industries, LLC, Phoenix, AZ (US)

(*) Notice: Subject to any disclaimer, the term of this patent is extended or adjusted under 35 U.S.C. 154(b) by 456 days.

(21) Appl. No.: 11/951,085

(22) Filed: Dec. 5, 2007

(65) Prior Publication Data
US 2008/0136541 A1 Jun. 12, 2008

(30) Foreign Application Priority Data

Dec. 7, 2006 (JP) ................................ 2006-330282

(51) Int. Cl.
*H03B 5/32* (2006.01)
*H03B 5/06* (2006.01)
*H03B 5/36* (2006.01)

(52) U.S. Cl.
CPC ........ *H03B 5/364* (2013.01); *H03B 2200/0012* (2013.01); *H03B 5/06* (2013.01); *H03B 2200/0046* (2013.01); *H03B 2200/0094* (2013.01)
USPC .................. 331/158; 331/116 R; 331/116 FE

(58) Field of Classification Search
USPC .................................. 331/158, 116 R, 116 FE
See application file for complete search history.

(56) References Cited

U.S. PATENT DOCUMENTS

| | | | | |
|---|---|---|---|---|
| 5,162,757 A | * | 11/1992 | Williams et al. | 331/75 |
| 5,208,558 A | * | 5/1993 | Shigehara et al. | 331/116 FE |
| 5,557,243 A | * | 9/1996 | Ho | 331/158 |
| 6,118,348 A | * | 9/2000 | Narahara | 331/116 FE |
| 7,009,458 B2 | * | 3/2006 | Gazit | 331/116 R |
| 7,042,298 B2 | * | 5/2006 | Nakahi et al. | 331/158 |
| 7,123,109 B2 | * | 10/2006 | Stevenson et al. | 331/109 |
| 7,138,881 B2 | * | 11/2006 | Lin | 331/158 |

FOREIGN PATENT DOCUMENTS

| | | |
|---|---|---|
| JP | 1-156622 | 10/1989 |
| JP | 3-76404 | 4/1991 |
| JP | 4-200009 | 7/1992 |
| JP | 4-200011 | 7/1992 |
| JP | 5-75343 | 3/1993 |
| JP | 10-135741 | 5/1998 |
| JP | 10-224147 A | 8/1998 |
| JP | 11-17451 | 1/1999 |
| JP | 11-234043 | 8/1999 |
| JP | 2000-286637 | 10/2000 |
| JP | 2002-135052 | 5/2002 |
| JP | 2004-40487 | 2/2004 |
| JP | 2004-242241 | 8/2004 |

* cited by examiner

*Primary Examiner* — Arnold Kinkead

(57) ABSTRACT

This invention is directed to achieve the oscillator circuit with a shorter oscillation stabilizing period and a lower consumption of the electric current. The oscillator circuit 10 has the amplifier circuit (inverter circuit 11), and the clock signal CLK is outputted from the output terminal of the inverter circuit 11. The inverter circuit 11 is configured from the first inverter 12 and the second inverter 13. The inverter circuit 11 is connected to the control circuit 30 and the control signal Ctrl controls the driving capacity of the inverter circuit 11. For example, high level control signals Ctrl 1 (H) and Ctrl 2 (H) are supplied to the first and the second inverters 12, 13 for a certain period of time right after the oscillator circuit 10 starts its operation until the oscillation is stabilized, operating both inverters. Then, either the first inverter 12 or the second inverter 13 continues its operation and the other inverter stops the operation.

20 Claims, 3 Drawing Sheets

US 8,890,632 B2

OSCILLATOR CIRCUIT

CROSS-REFERENCE OF THE INVENTION

This application claims priority from Japanese Patent Application No. 2006-330282, the content of which is incorporated herein by reference in its entirety.

BACKGROUND OF THE INVENTION

1. Field of the Invention

This invention relates to an oscillator circuit used in devices such as microcomputer.

2. Description of the Related Art

An oscillator circuit used in a semiconductor integrated circuit such as a microcomputer which uses a solid-state oscillator (a portion that generates oscillation of its resonant frequency when it receives voltage), such as crystal oscillator and ceramic oscillator has been widely known.

FIG. 3 is a simplified view of the oscillator circuit of prior arts. The oscillator circuit 100 has an inverter 101 made of a CMOS inverter as an amplifier circuit in a LSI. A clock signal CLK is outputted from the output terminal of the inverter circuit 101. The input terminal and the output terminal of the inverter circuit 101 are connected to a pair of outside terminals (outside connection terminals 102, 103). A feedback resistor 104, which gives bias to the inverter 101, is connected parallel to the inverter circuit 101 between the outside connection terminal 102 and the outside connection terminal 103.

Also, an outside oscillator 105 (a ceramic oscillator or a crystal oscillator) is connected between the outside connection terminal 102 and the outside connection terminal 103 outside of the LSI. Capacitor elements 106 and 107 are connected between the both terminals of the oscillator 105 and ground terminals GND. The electric capacity (F) of the capacitor elements 106 and 107 are designed to acquire a clock signal CLK of the desired frequency. This is the summary of the configuration of the oscillator circuit 100 of prior arts.

A certain amount of time is required for the oscillation of the oscillator circuit 100 to stabilize after the circuit starts oscillating. The duration of this time is called an oscillation stabilizing period hereinafter. The amplitude of the clock signal CLK is small and the signal does not have a high enough frequency component until the oscillation stabilizing period is passed. Therefore, the specification for the clock signal for operating a microcomputer can not be fulfilled until the oscillation stabilizing period is passed.

Therefore, the driving capacity of the inverter 101 is set high in order to shorten the oscillation stabilizing period in the oscillator circuit 100 of prior arts. That is, the size of the transistors (GW/GL), which make up the circuit, is set large for the inverter 101 to have low output impedance. Here, the GW means the channel width and the GL means the channel length of the transistor Technologies mentioned above are disclosed in Japanese Patent Application Publication No. H10-224147.

However, while the oscillation stabilizing period is shortened, the consumption of the electric current increases when the size of the transistor making up the inverter 101 is large.

Therefore, this invention is directed to the oscillator circuit with a short oscillation stabilizing period and a low consumption of electric current.

SUMMARY OF THE INVENTION

The invention provides an oscillator circuit including an oscillator having a first terminal and a second terminal; a first capacitor element connected between the first terminal of the oscillator and a ground terminal; a second capacitor element connected between the second terminal of the oscillator and the ground terminal; an amplifier circuit connected parallel to the oscillator; and a control circuit controlling the driving capacity of the amplifier circuit.

DETAILED DESCRIPTION OF THE INVENTION

An embodiment of this invention will be explained by referring to figures. The same numerical is given to the same configuration as that of prior arts and explanation on those configurations will be omitted.

Figure 1:
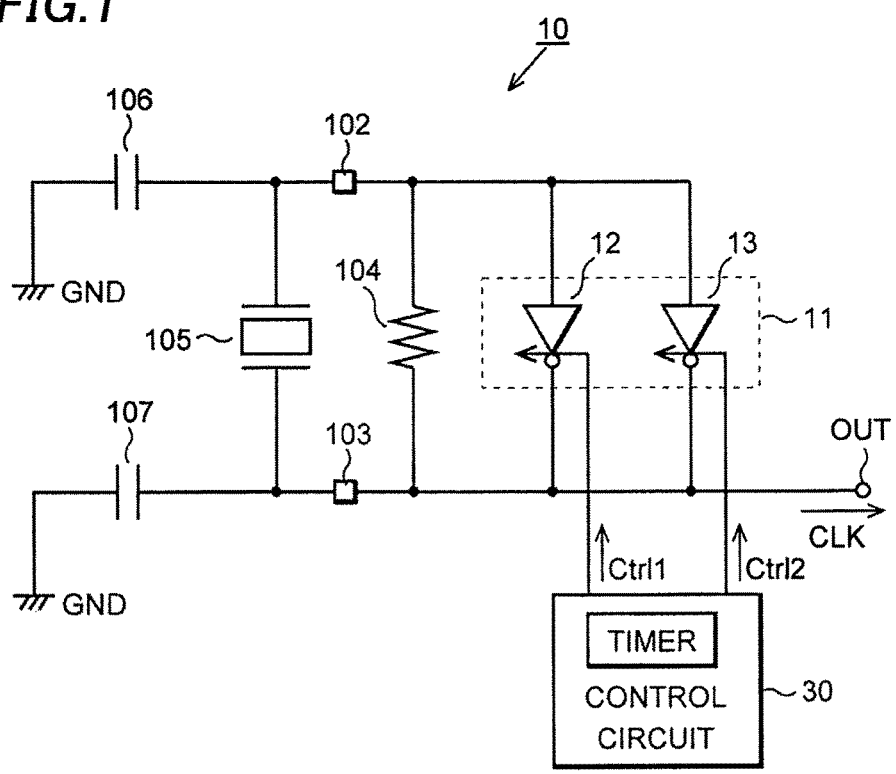
FIG. 1 is a circuit diagram of the oscillator circuit of an embodiment of this invention.

FIG. 1 is a simplified circuit diagram of an example of the oscillator circuit 10 of an embodiment of this invention. The oscillator circuit 10 has an inverter circuit 11 that includes a CMOS inverter as an amplifier circuit inside the LSI. A clock signal CLK is outputted from the inverter circuit 11 through an output terminal.

The output terminal and input terminal of the inverter circuit 11 are connected to a pair of outside terminals (an outside connection terminal 102 and an outside connection terminal 103). A feedback resistor 104 is connected parallel to the inverter circuit 11 between the outside connection terminal 102 and the outside connection terminal 103.

Figure 2:
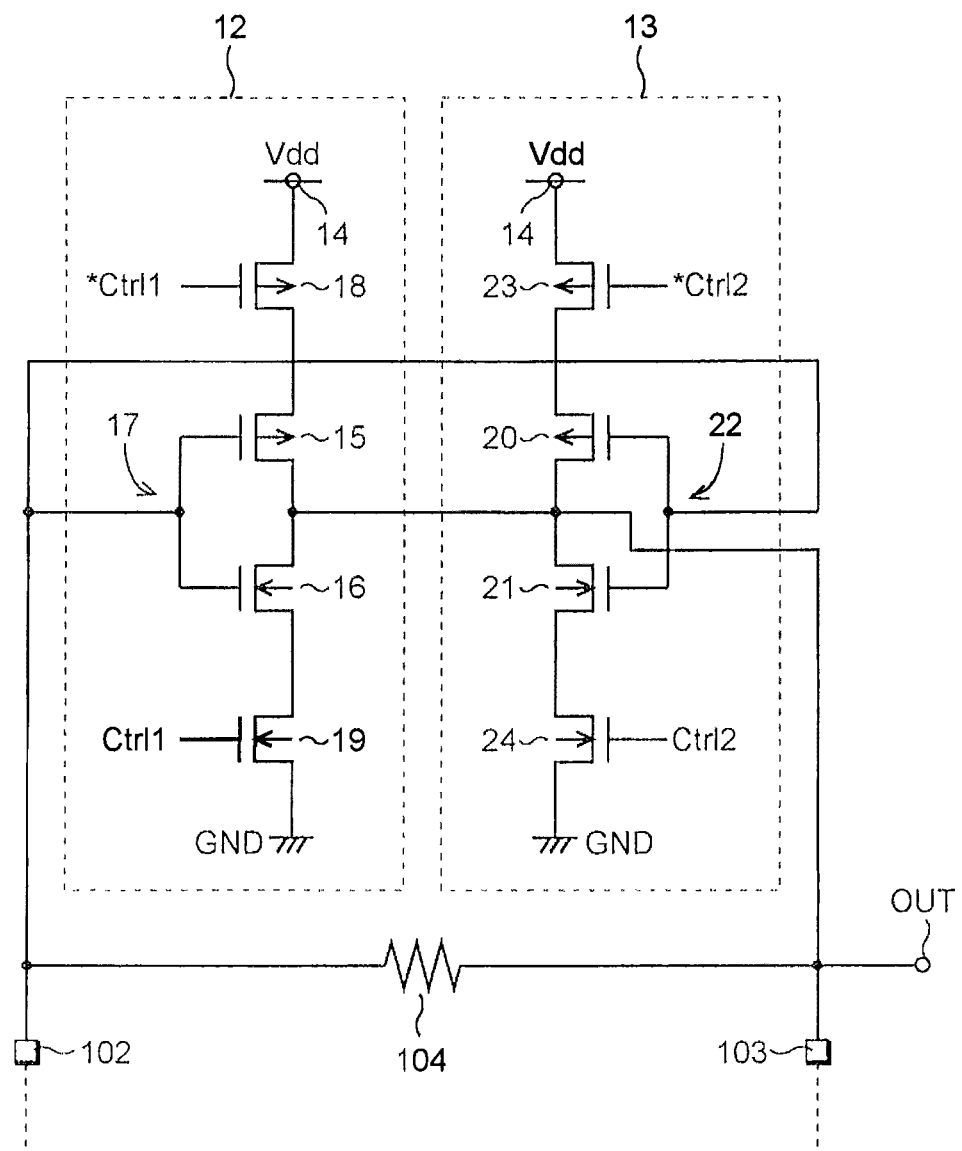
FIG. 2 is a circuit diagram showing an example of the inverter circuit of an embodiment of this invention.
Figure 3:
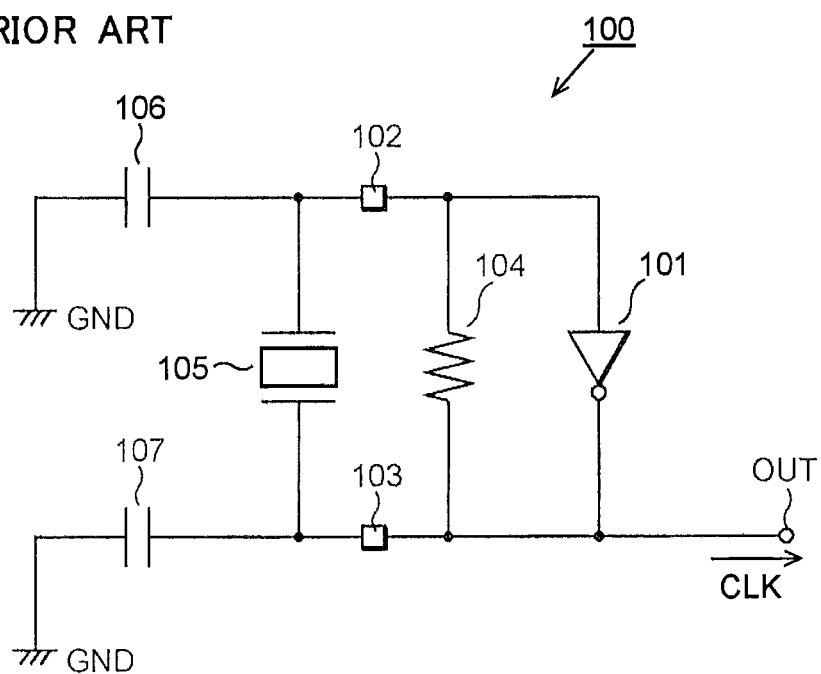
FIG. 3 is a circuit diagram of the oscillator circuit of prior arts.

The inverter circuit 11 includes a first inverter 12 with a first switch element and a second inverter 13 with a second switch element. The first inverter 12 has, for example as shown in FIG. 2, a CMOS inverter 17 that includes a P channel type MOS transistor (referred to as PMOS hereinafter) connected between a terminal 14 supplying power source voltage Vdd (referred to as a power supplying terminal, hereinafter) and a ground terminal GND and an NMOS 19, a PMOS 18 for switching connected between the power supplying terminal 14 and the PMOS 15, and an NMOS 19 for switching connected between the NMOS 16 and the ground terminal GND. The second inverter 13 has a CMOS inverter 22 that includes a PMOS 20 and an NMOS 21, and a PMOS 23 and an NMOS 24 for switching.

The inverter circuit 11 is connected to a control circuit 30 and the driving capacity of the inverter circuit 11 is controlled in response to a control signal Ctrl supplied form the control circuit 30. For example, a high level control signals Ctrl 1 (H) and Ctrl 2 (H) are supplied to the first and the second inverters 12, 13 from the time when the oscillator circuit starts its operation until the oscillation is stabilized. Therefore, the PMOS 18, the PMOS 23, the NMOS 19 and the NMOS 24 are turned on, and the first and second inverters 12 and 13 operate simultaneously. *Ctrl in FIG. 2 means the control signal that has a phase opposite from the control signal Ctrl.

Either one of the control signals Ctrl 1 or Ctrl 2 is switched from high level to low level by the control circuit 30 after the oscillation stabilizing period passes, that is, after the oscillation is stabilized. Therefore, either the pair of PMOS 18 and NMOS 19 or the pair of PMOS 23 and NMOS 24 is turned off. Then, either the first inverter 12 or the second inverter 13 continues its operation and the other inverter stops the operation. In other words, the control circuit 11 controls the number of the operating inverters, adjusting the driving capacity of the inverter 11 as a whole. The driving capacities of the first and the second inverters 12, 13 are supposed to be designed in such way that they do not cause any damaging influence on the generation of the clock signal CLK even if only one inverter is operating.

The control circuit 30 includes, at least, a timer circuit (not shown in the figure), which counts the time passed from the beginning of the oscillation. The time when either one of the control signals Ctrl 1 or Ctrl 2 should be changed can be arbitrarily determined by using the timer circuit according to the duration of the oscillation stabilizing period.

An outside oscillator 105 (a ceramic oscillator or a crystal oscillator) is connected parallel to the inverter 11 and the feedback resistor 104 between the outside oscillator terminal 102 and the outside oscillator terminal 103 outside of the LSI. The capacitor elements 106 and 107 are connected between the both terminals of the oscillator 105 and the ground terminals GND respectively.

As it is explained above, the driving capacity of the inverter 11 is adjusted according to the time passed since the start of the oscillation by the control circuit 30 in this embodiment. Therefore, the shorter oscillation stabilizing period can be secured by operating the inverter 11 with high driving capacity right after the oscillation starts until the oscillation is stabilized. Then, the lower consumption of electric current can be achieved by operating only a part of the inverter 11 after the oscillation stabilizing period is passed. For example, if the transistors of the first and the second inverters 12, and 13 are of the same size, the consumption of electric current after the oscillation stabilizing period can be cut by about half compared to the consumption of the electric current before the oscillation is stabilized.

This invention is not limited to the embodiment described above and it can be modified within its scope. For example, the number of individual inverters in the inverter 11 may be more than 2. Also, the size of the transistors may differ between the first inverter 12 and the second inverter 13 to optimize the consumption of electric current. This invention can be broadly applied to the oscillator circuit with the oscillator.

The oscillator circuit of this embodiment includes the control circuit for adjusting the driving capacity of the amplifier circuit of the oscillator circuit. The adjustment of the driving capacities before and after the oscillation stabilizing period becomes possible, achieving the oscillator circuit with the shorter oscillation stabilizing period and the lower consumption of electric current.

What is claimed is:

1. An oscillator circuit comprising:
   an oscillator comprising a first terminal and a second terminal;
   a first capacitor element connected between the first terminal of the oscillator and a ground terminal;
   a second capacitor element connected between the second terminal of the oscillator and the ground terminal;
   an amplifier circuit connected parallel to the oscillator;
   a timer circuit counting time passing from a beginning of oscillation of the oscillator circuit to a stabilization of oscillation of the oscillator circuit; and
   a control circuit controlling a driving capacity of the amplifier circuit in accordance with the time counted by the timer circuit,
   wherein the timer circuit is configured to count only one time period for the control circuit to control the driving capacity of the amplifier circuit,
   the amplifier circuit comprises a first inverter circuit and a second inverter circuit that are connected parallel to the oscillator and independently controlled by the control circuit,
   the first and second inverter circuits are connected to the oscillator while the timer circuit counts the time passing from the beginning of oscillation of the oscillator circuit to the stabilization of oscillation, and
   wherein the first inverter circuit has first and second inverter transistors, the second inverter circuit has first and second inverter transistors, and sizes of corresponding inverter transistors differ between the first inverter circuit and the second inverter circuit such that the first and second inverters have different driving capacities.

2. The oscillator circuit of claim 1, wherein the control circuit is configured to control the amplifier circuit to have a first driving capacity before the timer circuit counts a predetermined time from a beginning of an oscillation of the oscillator circuit and to have a second driving capacity that is smaller than the first driving capacity after the timer circuit counts the predetermined time.

3. The oscillator circuit of claim 1, wherein the control circuit controls the first and second inverter circuits so that the first and second inverter circuits operate before the timer circuit counts a predetermined time and one of the first and second inverter circuits continues to operate and another of the first and second inverter circuits stops after the timer circuit counts the predetermined time.

4. The oscillator circuit of claim 1, wherein the oscillator comprises a ceramic oscillator or a crystal oscillator.

5. The oscillator circuit of claim 1, wherein the amplifier circuit, the timer circuit, and the control circuit are combined on a single intergrated circuit.

6. The oscillator circuit of claim 1, further comprising a resistor having a first terminal coupled to the first terminal of the oscillator, and a second terminal coupled to the second terminal of the oscillator.

7. An integrated circuit comprising:
   a first outside connection terminal adapted to couple to a first terminal of an outside oscillator;
   a second outside connection terminal adapted to couple to a second terminal of an outside oscillator;
   a first inverter having an input terminal connected to the first outside connection terminal, a control terminal for receiving a first control signal, and an output terminal connected to the second outside connection terminal;
   a second inverter having an input terminal connected to the first outside connection terminal, a control terminal for receiving a second control signal, and an output terminal connected to the second outside connection terminal; and
   a control circuit for indepedently providing the first and second control signals, wherein the control circuit provides both the first and second control signals in an oscillation stabilizing period, and only one of the first and second control signals after the oscillation stabilizing period,
   wherein the first inverter has first and second inverter transistors, the second inverter has first and second inverter transistors, and sizes of corresponding inverter transistors differ between the first inverter and the second inverter such that the first and second inverters have different driving capacities.

8. The integrated circuit of claim 7, further comprising:
   a resistor having a first terminal coupled to the first outside connection terminal, and a second terminal coupled to the second outside connection terminal.

9. The integrated circuit of claim 7, wherein the first inverter comprises:
- a first inverter transistor having a first current electrode, a control electrode coupled to the first outside connection terminal, and a second current electrode coupled to the second outside connection terminal; and
- a second inverter transistor having a first current electrode coupled to the second current electrode of the first inverter transistor, a control electrode coupled to the first outside connection terminal, and a second current electrode.

10. The integrated circuit of claim 9, wherein the first inverter further comprises:
- a first switching transistor having a first current electrode coupled to a power source terminal, a control electrode for receiving a complement of the first control signal, and a second current electrode coupled to the first current electrode of the first inverter transistor; and
- a second switching transistor having a first current electrode coupled to the second current electrode of the second inverter transistor, a control electrode for receiving the first control signal, and a second current electrode coupled to a ground terminal.

11. The integrated circuit of claim 10, wherein the first inverter transistor and the first switching transistors comprise PMOS transistors, and the second inverter transistor and the second switching transistor comprise NMOS transistors.

12. The integrated circuit of claim 7, further comprising:
- a timer circuit counting time to determine the oscillation stabilizing period.

13. The integrated circuit of claim 7, wherein the integrated circuit is a microcomputer and the output terminals of the first and second inverters provide a clock signal for operating the microcomputer.

14. An integrated circuit comprising:
- a first outside connection terminal adapted to couple to a first terminal of an outside oscillator;
- a second outside connection terminal adapted to couple to a second terminal of an outside oscillator;
- an inverter circuit comprising a plurality of inverters each having an input terminal connected to the first outside connection terminal, a control terminal for receiving a respective control signal of a plurality of control signals, and an output terminal connected to the second outside connection terminal; and
- a control circuit for indepedently providing each respective control signal, wherein the control circuit provides both all of the plurality of control signals in an oscillation stabilizing period, and less than all of the plurality of control signals after the oscillation stabilizing period,
wherein each inverter has first and second inverter transistors, and sizes of corresponding inverter transistors differ between at least two inverters of the plurality of inverters such that the first and second inverters have different driving capacities.

15. The integrated circuit of claim 14, wherein a number of inverters of the plurality of inverters is more than two.

16. The integrated circuit of claim 14, wherein each inverter comprises:
- a first inverter transistor having a first current electrode, a control electrode coupled to the first outside connection terminal, and a second current electrode coupled to the second outside connection terminal; and
- a second inverter transistor having a first current electrode coupled to the second current electrode of the first inverter transistor, a control electrode coupled to the first outside connection terminal, and a second current electrode.

17. The integrated circuit of claim 16, wherein each inverter further comprises:
- a first switching transistor having a first current electrode coupled to a power source terminal, a control electrode for receiving a complement of the respective control signal, and a second current electrode coupled to the first current electrode of the first inverter transistor; and
- a second switching transistor having a first current electrode coupled to the second current electrode of the second inverter transistor, a control electrode for receiving the respective control signal, and a second current electrode coupled to a ground terminal.

18. The integrated circuit of claim 16, wherein the first inverter transistor and the first switching transistor comprise PMOS transistors, and the second inverter transistor and the second switching transistor comprise NMOS transistors.

19. The integrated circuit of claim 14, further comprising:
- a timer circuit counting time to determine the oscillation stabilizing period.

20. The integrated circuit of claim 14, wherein the integrated circuit is a microcomputer and the output terminals of each of the plurality of inverters provide a clock signal for operating the microcomputer.

\* \* \* \* \*